(12) United States Patent
Wang et al.

(10) Patent No.: US 11,860,253 B2
(45) Date of Patent: Jan. 2, 2024

(54) SYSTEMS, APPARATUSES, AND METHODS FOR THE TRANSIT OF SUPERCONDUCTING MAGNETS

(71) Applicant: SHANGHAI UNITED IMAGING HEALTHCARE CO., LTD., Shanghai (CN)

(72) Inventors: Peng Wang, Shanghai (CN); Jin Qian, Shanghai (CN); Xijin Tan, Shanghai (CN); Baogang Peng, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 753 days.

(21) Appl. No.: 16/935,230

(22) Filed: Jul. 22, 2020

(65) Prior Publication Data

US 2021/0302517 A1 Sep. 30, 2021

(30) Foreign Application Priority Data

Mar. 25, 2020 (CN) .......................... 202020395168.8

(51) Int. Cl.
- *H01F 6/04* (2006.01)
- *G01R 33/38* (2006.01)
- *H01F 6/06* (2006.01)
- *G01R 33/3815* (2006.01)

(52) U.S. Cl.
CPC ..... *G01R 33/3802* (2013.01); *G01R 33/3804* (2013.01); *G01R 33/3815* (2013.01); *H01F 6/04* (2013.01); *H01F 6/06* (2013.01)

(58) Field of Classification Search
CPC ............ G01R 33/3802; G01R 33/3804; F17C 2270/0509; F17C 2270/0527; F17C 2270/0536; B65D 88/121
See application file for complete search history.

(56) References Cited

U.S. PATENT DOCUMENTS

| | | | |
|---|---|---|---|
| 7,733,089 B2 | 6/2010 | Hobbs et al. | |
| 10,577,175 B2 | 3/2020 | Rogers et al. | |
| 2007/0120631 A1 | 5/2007 | Hobbs et al. | |
| 2010/0016168 A1 | 1/2010 | Atkins et al. | |

FOREIGN PATENT DOCUMENTS

| | | | |
|---|---|---|---|
| CN | 204363987 U | | 6/2015 |
| CN | 205972500 U | | 2/2017 |
| CN | 207634613 U | * | 7/2018 |
| CN | 208361001 U | | 1/2019 |
| CN | 110745392 A | | 2/2020 |

* cited by examiner

*Primary Examiner* — Ramon M Barrera
(74) *Attorney, Agent, or Firm* — METIS IP LLC

(57) ABSTRACT

Systems, apparatuses, and methods for the transit of a superconducting magnet are provided. The apparatuses may include a compressor configured to compress a cryogen after the cryogen cools a superconducting magnet in the transit of the superconducting magnet. The compressed cryogen may be used to cool the superconducting magnet. The apparatuses may also include a power supply device configured to provide power to the compressor and a thermal management system configured to in thermal communication with the compressor. The apparatuses may further include a container configured to accommodate at least one of the compressor, the thermal management system, and the power supply device.

17 Claims, 10 Drawing Sheets

SYSTEMS, APPARATUSES, AND METHODS FOR THE TRANSIT OF SUPERCONDUCTING MAGNETS

CROSS-REFERENCE TO RELATED APPLICATIONS

This application claims priority of Chinese Patent Application No. 202020395168.8, filed on Mar. 25, 2020, the contents of which are hereby incorporated by reference.

TECHNICAL FIELD

The disclosure generally relates to the technology field of superconducting magnets, and more particularly, to system and apparatus for the transit of the superconducting magnets.

BACKGROUND

Magnetic resonance imaging (MRI) is a medical imaging technology widely used for the diagnosis and/or research of an anatomical structure and/or function of a healthy body and/or a sick body. During an MRI process, a patient may be placed in a strong magnetic field and be excited with radiofrequency (RF) signals to generate nuclear magnetic resonance (NMR). MR signals (e.g., echoes) indicating the NMR may be received. An image relating to the patient may be generated based on the received MR signals.

An MRI system may include one or more core components such as an MR superconducting magnet (e.g., superconducting coil) to provide the strong magnetic field. To maintain the superconductivity, the superconducting magnet may need to be exposed at a critical temperature, e.g., close to absolute zero. Generally, liquid helium is used as a cryogen to achieve the temperature requirement. However, liquid helium is relatively expensive and difficult to be operated. In the long-distance transit of the superconducting magnet, the cryogen may be consumed without refrigeration, resulting in a loss of the cryogen. In addition, the superconducting magnet may be at a risk of a magnetic quench after the temperature of the liquid helium rises. Therefore, it is desirable to provide systems and apparatuses for the transit of a superconducting magnet with efficiency.

SUMMARY

In an aspect of the present disclosure, an apparatus for the transit of a superconducting magnet may be provided. The apparatus may include a compressor configured to compress a cryogen after the cryogen cools a superconducting magnet in the transit of the superconducting magnet. The compressed cryogen may be used to supply refrigeration for the superconducting magnet. The apparatus may also include a power supply device configured to provide power to the compressor. The apparatus may also include a thermal management system in thermal communication with the compressor. The apparatus may further include a container configured to accommodate at least one of the compressor, the thermal management system, and the power supply device.

In some embodiments, the container may include a first compartment and a second compartment. At least one of the compressor or the thermal management system may be located in the first compartment. The power supply device may be located in the second compartment. The power supply device may be electronically connected with the compressor.

In some embodiments, the second compartment may be detachably connected with the first compartment.

In some embodiments, the thermal management system may include an air-cooled device that is in thermal communication with the compressor via air.

In some embodiments, the air-cooled device may include a heat exchanger configured to absorb heat generated by the compressor using air. The air-cooled device may also include an exhaust fan mounted on a shell of the container. The air-cooled device may further include a tube in fluid communication with the heat exchanger and the exhaust fan, the tube may be configured to guide the heated air to flow from the heat exchanger to the exhaust fan.

In some embodiments, the container may include a first vent through which the heated air may be exhausted from the container via the exhaust fan and a second vent through which the air flows into the container.

In some embodiments, the apparatus may further include an exhaust component located outside the container. The exhaust component may include a first part connected with the exhaust fan through the first vent. The first part may be hollow and may be configured with at least one hole. The exhaust component may also include a second part configured to shelter the first vent and connected with the first part, the first vent may be within a projection region of the second part on the container.

In some embodiments, the apparatus may further include a damping device mounted in the container. The damping device may include one or more damping springs. An end of each of the one or more damping springs may be mounted on a bottom of the container. The damping device may further include a connection plate mounted between the one or more damping springs and the compressor, the connection plate may be configured to support the compressor.

In some embodiments, the apparatus may further include a temperature sensor configured to detect a temperature in the container.

In some embodiments, the apparatus may further include a control device configured to control an operation of each of one or more components in the apparatus.

In some embodiments, the control device may be configured to obtain a power level of the power supply device and send the power level to a terminal.

In some embodiments, the first compartment and the second compartment may share a sidewall. The second compartment may include a structure of a load-carrying framework.

In some embodiments, the power supply device may include a diesel generator.

In another aspect of the present disclosure, a magnetic resonance (MR) system is provided. The MR system may include a superconducting magnet that is located in a cryostat including a refrigeration device. The MR system may also include a compressor in fluid communication with the refrigeration device. The compressor may be configured to compress a cryogen after the cryogen cools the superconducting magnet. The refrigeration device may be configured to supply refrigeration of the superconducting magnet using the compressed cryogen in a transit of the superconducting magnet. The MR system may also include a thermal management system. The thermal management system may include an air-cooled device configured to be in thermal communication with the compressor via air. The MR system may further include a container configured to accommodate the compressor or the thermal management system.

In some embodiments, the MR system may further include a power supply configured to provide power to at least one of the compressor, the refrigeration device, or the thermal management system.

In some embodiments, the container may include a first compartment and a second compartment. At least one of the compressor or the thermal management system may be located in the first compartment. A power supply device may be located in the second compartment. The power supply device may be electronically connected with the compressor.

In some embodiments, the air-cooled device may include a heat exchanger configured to absorb heat generated by the compressor using air. The air-cooled device may also include an exhaust fan mounted on a shell of the container. The air-cooled device may further include a tube in fluid communication with the heat exchanger and the exhaust fan. The tube may be configured to guide the heated air to flow from the heat exchanger to the exhaust fan.

In another aspect of the present disclosure, a system is provided. The system may include a driving cab configured to control a transit of a medical device. The system may also include a cryostat configured to accommodate the medical device and provide a low temperature for the medical device. The cryostat may include a refrigeration device. The system may also include a compressor in fluid communication with the refrigeration device. The compressor may be configured to compress a cryogen after the cryogen cools a superconducting magnet of the medical device. The refrigeration device may be configured to supplying refrigeration of the superconducting magnet using the compressed cryogen in the transit of the medical device. The system may also include a thermal management system. The thermal management system may include an air-cooled device configured to be in thermal communication with the compressor via air. The system may also include a container configured to accommodate at least one of the compressor, the thermal management system and the cryostat. The system may further include a movable platform in communication with the driving cab, the moveable platform may be configured to support the container.

In some embodiments, the system may further include a power supply configured to provide power to at least one of the compressor, the refrigeration device, or the thermal management system.

In some embodiments, the container may include a first compartment and a second compartment. At least one of the compressor or the thermal management system may be located in the first compartment. A power supply device may be located in the second compartment. The power supply device may be electronically connected with the compressor.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings.

The drawings are not to scale. These embodiments are non-limiting exemplary embodiments, in which like reference numerals represent similar structures throughout the several views of the drawings, and wherein.

DETAILED DESCRIPTION

Figure 1:
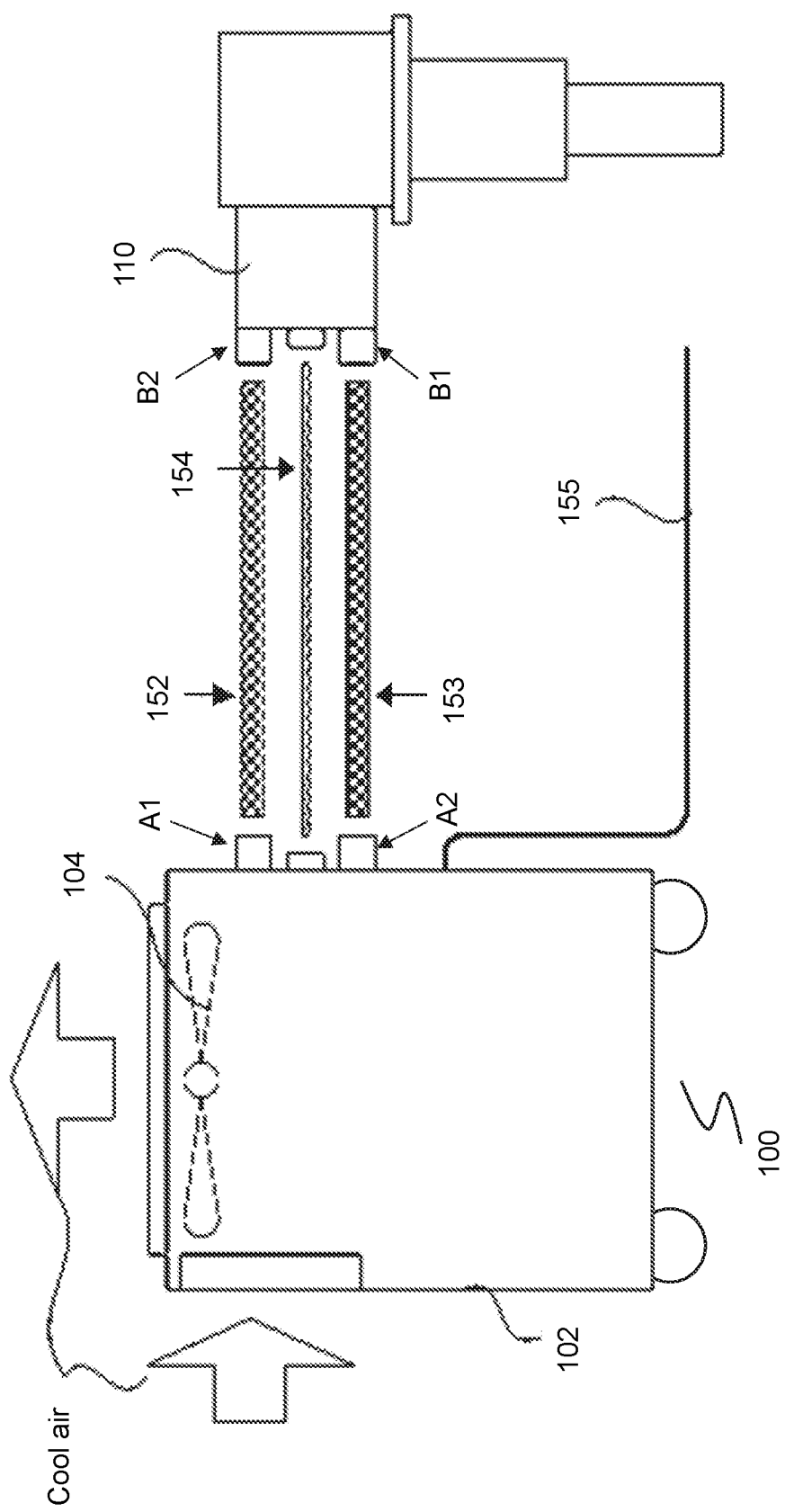
FIG. 1 is a schematic diagram illustrating an exemplary apparatus for the transit of a superconducting device according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the terms "system," "engine," "unit," "module," and/or "block" used herein are one method to distinguish different components, elements, parts, sections, or assemblies of different levels in ascending order. However, the terms may be displaced by another expression if they achieve the same purpose.

Generally, the words "module," "unit," or "block," as used herein, refer to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items. The terms "first," "second," "third," etc. are used to distinguish similar objects and does not denote a specific ranking of the objects.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and apparatus related to the transit of superconducting devices. A superconducting device may refer to a device made of a superconducting material (e.g., niobium-titanium (NbTi), niobium-tin ($Nb_3Sn$), niobium-aluminum ($Nb_3Al$)). A superconducting device may need to be exposed at a relatively low temperature (e.g., approximately absolute zero) to maintain the superconductivity according to different superconducting materials. In some embodiments, the superconducting device may be applied in various fields such as rail transportation, power electronics, medical devices. etc. For illustration purposes, a medical device may be taken as an example to facilitate the understanding of the superconducting device, which is not intended to limit the scope of the present disclosure. Merely by way of example, the medical device may include an MR scanner, an MR and radiation therapy (MR-RT) scanner, a positron emission computed tomography and MR (PET-MR) scanner, etc., that includes a superconducting magnet.

An aspect of the present disclosure relates to an apparatus for the transit of the superconducting magnet. The apparatus may include a compressor configured to compress a cryogen after the cryogen cools a superconducting magnet in the transit of the superconducting magnet. The apparatus may also include a power supply device configured to provide power to at least the compressor and a thermal management system (e.g., including an air-cooled device) configured to be in thermal communication with (e.g., cool) the compressor. The apparatus may further include a container configured to accommodate at least one of the compressor, the thermal management system, and the power supply device. Accordingly, the compressor may compress the cryogen after the cryogen cools a superconducting magnet during a transit of the superconducting magnet and the compressed cryogen may be cooled by a refrigeration device of the cryostat. The cooled cryogen may be used to cool the superconducting magnet, which may reduce the loss of the cryogen and provide a low temperature for the superconducting magnet, thereby keeping the superconducting magnet in a superconducting state during the transit of the superconducting magnet.

In some embodiments, the apparatus may include a thermal management system configured to cool the compressor. The thermal management system may include an air-cooled device. According to some embodiments of the present disclosure, instead of a water-cooled device that has a relatively complex structure (e.g., including a water pump, pipes, pipe heat dissipation structures, etc.) and relatively large volume, the air-cooled device may be in fluid communication with the refrigeration device of the cryostat to cool the compressor, which can reduce a volume and complexity of the apparatus and has a relatively good heat dissipation performance during the transit of the superconducting magnet. Therefore, the apparatus may be convenient for transporting or shipping the superconducting magnet by a vehicle, a ship, an airplane, etc.

In some embodiments, the container may include a first compartment and a second compartment which accommodate the compressor and the power supply device separately, further improving the heat dissipation performance.

In some embodiments, a damping device may be mounted in the container to support the compressor, which can reduce the vibration of the compressor during the transit of the superconducting magnet.

In some embodiments, an exhaust component including a shelter part may be mounted outside the container, which can avoid foreign matters (e.g., rain, dust) from dropping into the compressor.

FIG. 1 is a schematic diagram illustrating an exemplary apparatus for the transit of a superconducting device according to some embodiments of the present disclosure. The apparatus 100 may be configured to refrigerate the superconducting device, e.g., during the transit of the superconducting device. For illustration purposes, the apparatus 100 may be configured to refrigerate a superconducting magnet of an MR scanner during the transit of the superconducting magnet. During the transit of the superconducting magnet, the superconducting magnet may be accommodated in a cryostat (not shown). The apparatus 100 may be physically connected with the cryostat to facilitate the refrigeration of the superconducting magnet.

In some embodiments, the cryostat may include a refrigeration device 110 (e.g., a cold head assembly) and a cryogen (e.g., helium or a hyperpolarized material) filled in the cryostat. The apparatus 100 may include at least a compressor 102 and a thermal management system 104. The refrigeration device 110 and the compressor 102 may cooperate with each other to refrigerate the superconducting magnet using the cryogen. For example, the compressor 102 may be configured to compress the cryogen after the cryogen cools the superconducting magnet. The refrigeration device 110 may be configured to supply refrigeration of the superconducting magnet using the compressed cryogen. The thermal management system 104 may be configured to be in thermal communication with (e.g., cool) the compressor 102 and/or the compressed cryogen. As shown in FIG. 1, the connection between the apparatus 100 and the cryostat may be achieved by physically connecting the compressor 102 with the refrigeration device 110 to form a circulating loop through which the cryogen may be circulated. Merely by way of example, to form the circulating loop, an inlet A1 of the compressor 102 may be connected with an outlet B2 of the refrigeration device 110 via a channel 152, and an outlet A2 of the compressor 102 may be connected with an inlet B1 of the refrigeration device 110 via a channel 153.

In some embodiments, the cryogen may be circulated in the circulating loop to achieve a heat exchange between the cryogen and the outside after the cryogen cools the superconducting magnet. For example, when the cryogen cools the superconducting magnet, the cryogen may perform heat exchange with the superconducting magnet, and the cryogen may be converted from a liquid state to a gas state after absorbing heat from the superconducting magnet. The gas cryogen may flow to the compressor 102 via the inlet A1 from the refrigeration device 150 via the outlet B2 through the channel 152. The compressor 102 may compress the gas cryogen from a relatively high temperature and a relatively low pressure to a relatively high temperature and pressure. Alternatively, the compressed gas cryogen may be cooled by the thermal management system 100 from the relatively high temperature and pressure to a relatively low temperature and a relatively high pressure. The gas cryogen with the relatively low temperature and the relatively high pressure may flow to the refrigeration device 150 via the inlet B1 through the channel 153 and be converted into a liquid cryogen by the refrigeration device 150. When the cryogen is compressed, the cryogen may generate a lot of heat and/or the compressor 102 may generate a lot of heat, which may result in an abnormal operation and/or malfunction of the compressor 102. Heat dissipation of the compressor 102 may be achieved by the thermal management system 100, thereby avoiding the abnormal operation and/or malfunction of the compressor 102 caused by overheat. More descriptions regarding the thermal management system 104 may be found elsewhere in the present disclosure (e.g., FIGS. 3-5 and the descriptions thereof).

In some embodiments, the apparatus 100 may further include a power supply device (e.g., a power supply device 310 as shown in FIGS. 3-6). The power supply device may include an external power supply device, a power generation device, etc., configured to supply power for at least one of the compressor 102, the thermal management system 104, or the refrigeration device 110. For example, the power supply device may be electronically connected with the compressor 102 via a power line 155 to provide power for the compressor 102. As another example, the compressor 102 may be electronically connected with the refrigeration device 104 via a power line 154. When the compressor 102 is powered, the compressor 102 may provide power for the refrigeration device 104 via the power line 154. As still another example, the power supply device may be electronically connected with the refrigeration device 150 to provide power for the refrigeration device 150. More descriptions regarding the power supply device may be found elsewhere in the present disclosure (e.g., FIGS. 3-5 and the descriptions thereof).

In some embodiments, the apparatus 100 may include a container that may be detachably mounted on a moveable platform (e.g., a vehicle). The cryostat, the compressor 102, and/or the thermal management system 100 may be located in the container. More descriptions regarding the container may be found elsewhere in the present disclosure (e.g., FIGS. 3-5 and the descriptions thereof).

It should be noted that the above description of the apparatus 100 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 2:
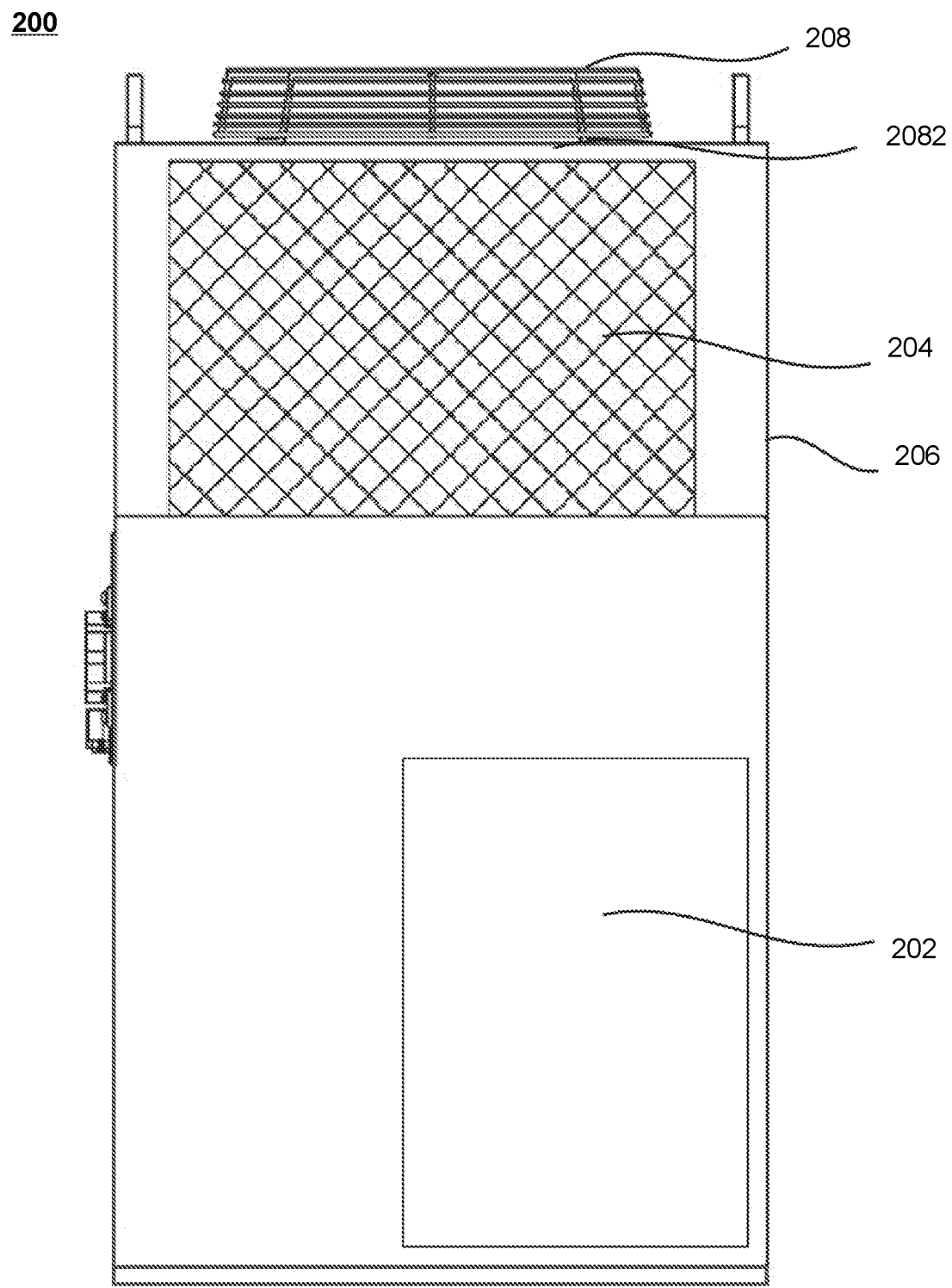
FIG. 2 is a schematic diagram illustrating an exemplary apparatus for the transit of a superconducting device according to some embodiments of the present disclosure.

FIG. 2 is a schematic diagram illustrating an exemplary apparatus for the transit of a superconducting device according to some embodiments of the present disclosure. The apparatus 200 may be configured to refrigerate the superconducting device (e.g., a medical device), e.g., during the transit of the medical device. For example, the apparatus 200 may accommodate the superconducting magnet and be located on a moving platform (e.g., a vehicle). The apparatus 200 may cool the superconducting magnet during the transmit of the superconducting magnet. As shown in FIG. 2, the apparatus 200 may include a compressor 202, a thermal management system 204, a container 206, an exhaust component 208, etc.

The compressor 202 may be configured to compress a cryogen after the cryogen cools the medical device. In some embodiments, the cryogen may be converted from a liquid state to a gas state after cooling the medical device. The compressor 202 may convert the gas cryogen with a relatively high temperature and a relatively low pressure to a compressed gas cryogen with a relatively high temperature and pressure. The compressed gas cryogen may be further converted to a compressed gas cryogen with a relatively low temperature and a relatively high pressure by being cooled by the thermal management system 204. In some embodiments, the compressor 202 may be mounted at any suitable position in the container 206. For example, the compressor 202 may be mounted at a position in the container close to a bottom of the container 206. As another example, the compressor 202 may be mounted at a position close to a refrigeration device (e.g., the refrigeration device 110 as shown in FIG. 1) in a cryostat which is used to accommodate the medical device.

The thermal management system 204 may be in thermal communication with (e.g., cool) the compressor 202. In some embodiments, the thermal management system 204 may include an air-cooled device. The air-cooled device may absorb heat generated by the compressor 202 using cool air entered from the outside of the container 206. The air-cooled device may exhaust the heated air from the container 206 to the outside. For example, the air-cooled device may include at least one of a heat exchanger, an exhaust fan and a tube. The heat exchanger may include one or more heat sinks made of metal (e.g., copper or aluminum alloy) configured to absorb the heat generated by the compressor 202. The absorbed heat may further be absorbed by the cool air. The heat exchanger may be mounted or integrated on a top of a shell of the compressor 202. The exhaust fan may be configured to exhaust the heated air to the outside of the container 206. The exhaust fan may be mounted above the heat exchanger and/or on a top of a shell of the container 206. The tube may be configured to provide an air flowpath along which the heated air may flow from the heat exchanger to the exhaust fan. The compressor may be in thermal communication with the thermal communication system 204 via the air flowpath. More descriptions regarding the air-cooled device may be found elsewhere in the present disclosure (e.g., FIGS. 3-6 and the descriptions thereof). The exhaust fan may be mounted above the heat exchanger and/or on a top of a shell of the container 206.

In some embodiments, the thermal management system 204 may include an air conditioner that is wall-mounted or floor mounted. The air conditioner may be thermally coupled to the compressor 202, that is, the air conditioner may be thermally connected with the compressor 202 to absorb the heat generated by the compressor 202.

The container 206 may be configured to accommodate one or more components (e.g., the compressor 202, and/or the thermal management system 204) of the apparatus 200. For example, at least one of the compressor 202 or the thermal management system 204 (e.g., both the compressor 202 and the thermal management system 204) may be located in the container 206. In some embodiments, the container 206 may be configured to accommodate the medical device (e.g., a cryostat accommodating a superconducting magnet). In some embodiments, the container 206 may include a first vent and a second vent. Air may flow from the outside of the container 206 into the container 206 through the second vent. The thermal management system 204 may absorb heat generated by the compressor 202 using the air. The thermal management system 204 may further exhaust the heated air from the container 206 through the first vent.

The exhaust component 208 may be configured to exhaust the heated air after the air absorbs the heat generated by the compressor 202. In some embodiments, the exhaust component 208 may further be configured for rain-protection, sun-protection, and dust-protection of the compressor 202 and/or the thermal management system 204. For example, the exhaust component 208 may be mounted outside the container 206 and shelter at least the first vent of the container 206, which may achieve rain-protection, sun-protection, and dust-protection of the compressor 202 and/or the thermal management system 204. More descriptions regarding the exhaust component 208 may be found elsewhere in the present disclosure (e.g., FIGS. 3-7 and the descriptions thereof).

It should be noted that the above description of the apparatus 200 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the apparatus 200 may not include the exhaust component 208 (i.e., the exhaust component 208 may be omitted). In some embodiments, the first vent may be set on the top of the container 206, and accordingly, the exhaust component 208 may be set above the top of the container 206 to shelter the first vent. In some embodiments, the apparatus 10 may further include one or more additional components such as a power supply device, a damping device, and/or one or more lifting lugs.

Figure 3:
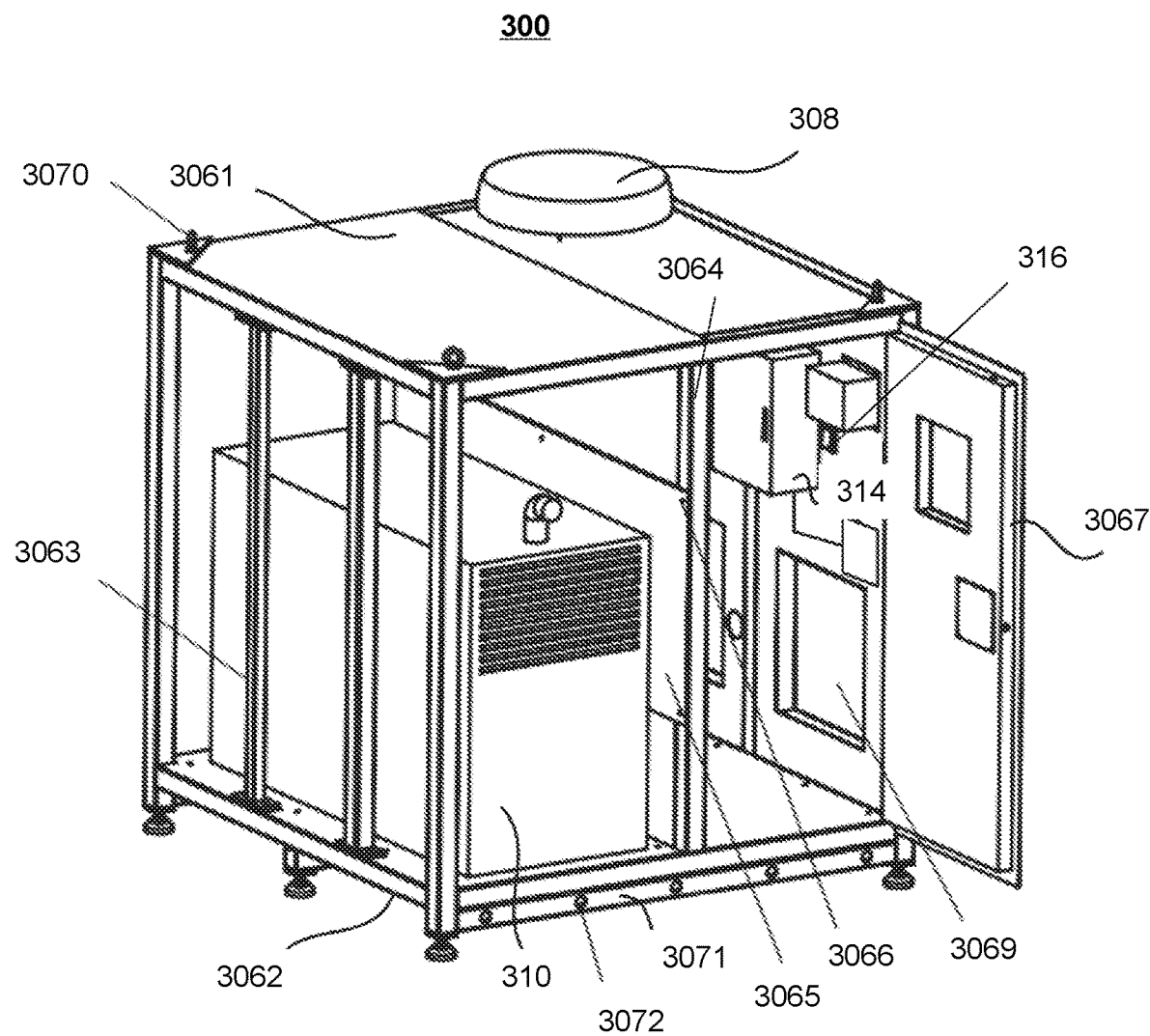
FIG. 3 is a schematic diagram illustrating an exemplary apparatus for the transit of a superconducting device according to some embodiments of the present disclosure.
Figure 4:
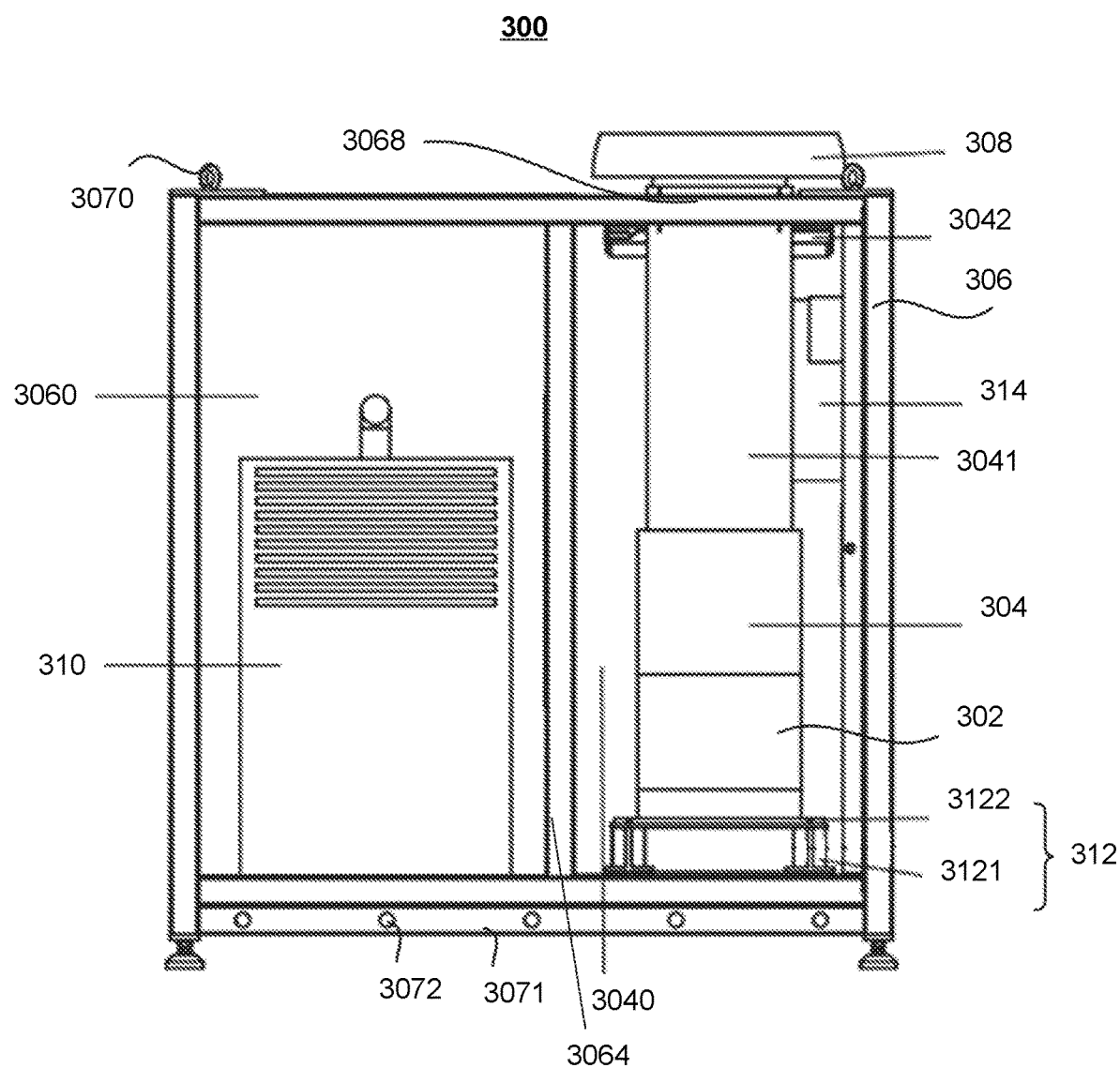
FIG. 4 is a schematic diagram illustrating a front view of the apparatus shown in FIG. 3 according to some embodiments of the present disclosure.
Figure 5:
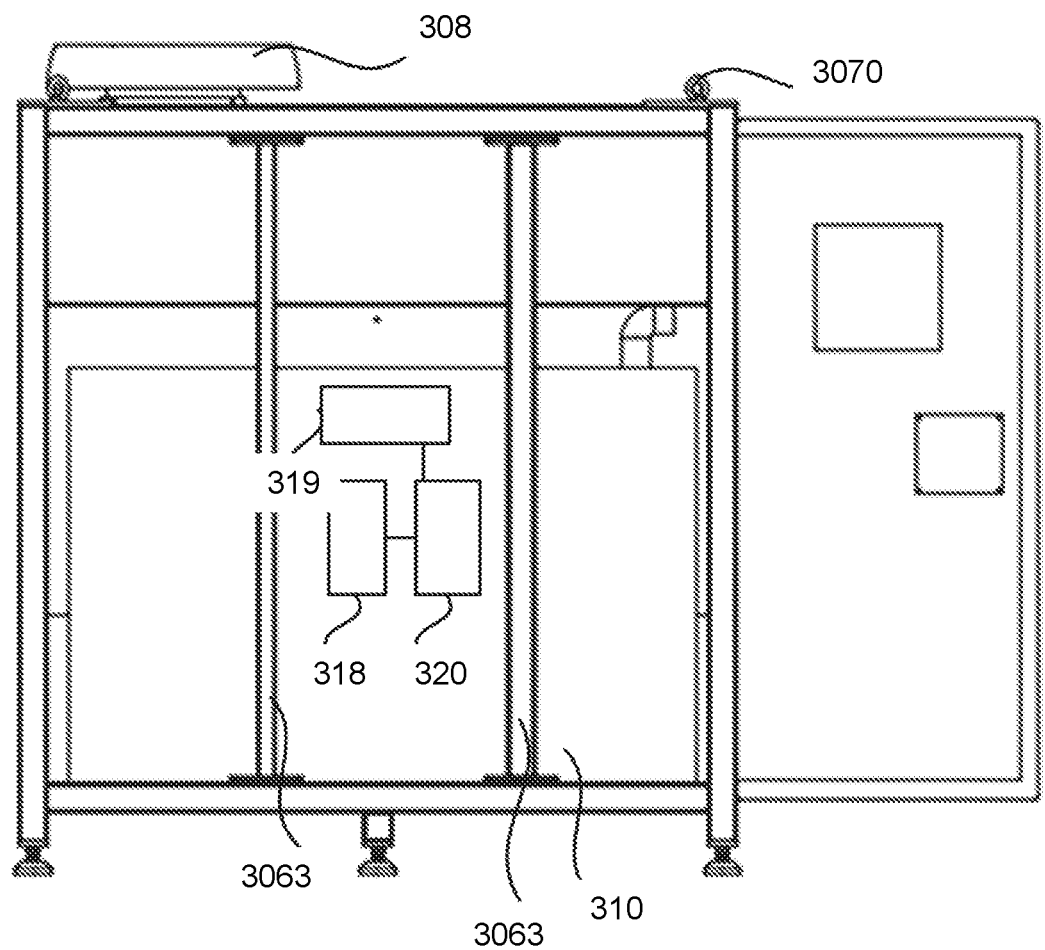
FIG. 5 is a schematic diagram illustrating a left view of the apparatus shown in FIG. 3 according to some embodiments of the present disclosure.
Figure 6:
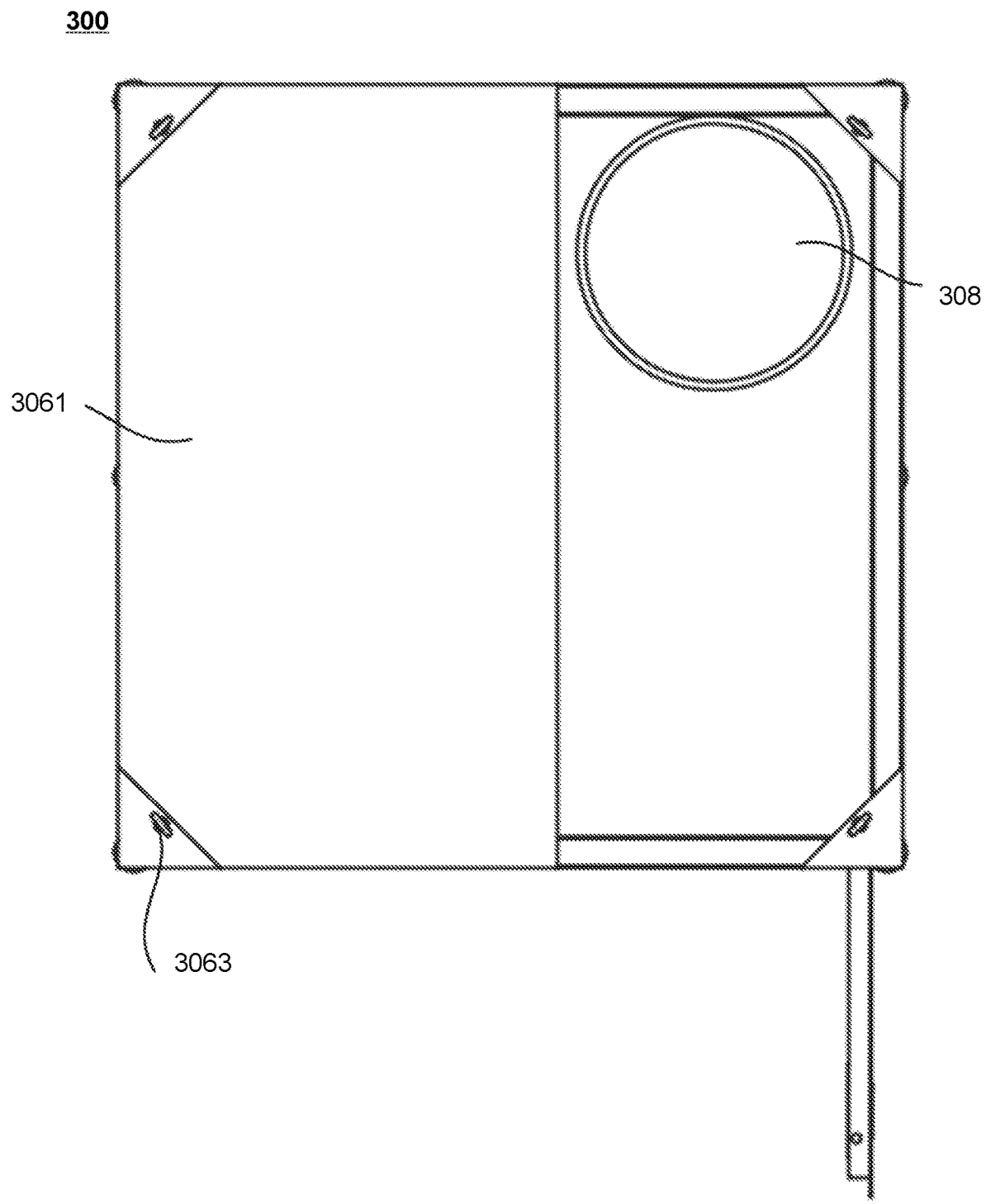
FIG. 6 is a schematic diagram illustrating a top view of the apparatus shown in FIG. 3 according to some embodiments of the present disclosure.

FIG. 3 is a schematic diagram illustrating an exemplary apparatus for the transit of a superconducting device according to some embodiments of the present disclosure. FIG. 4 is a schematic diagram illustrating a front view of the apparatus shown in FIG. 3 according to some embodiments of the present disclosure. FIG. 5 is a schematic diagram illustrating a left view of the apparatus shown in FIG. 3 according to some embodiments of the present disclosure. FIG. 6 is a schematic diagram illustrating a top view of the apparatus shown in FIG. 3 according to some embodiments of the present disclosure. The apparatus 300 may be similar or same as the apparatus 200 as illustrated in FIG. 2. For example, the apparatus 300 may include a compressor 302, a thermal management system 304, and a container 306, an exhaust component 308 that are similar to or same as the compressor 202, the thermal management system 204, the container 206, and the exhaust component 208, respectively as described in FIG. 2. The apparatus 300 may further include a power supply device 310, a damping device (also referred to as a damping platform) 312, etc.

The container 306 may be configured to accommodate and/or protect one or more components of the apparatus 300 and/or the medical device. For example, the compressor 302, the thermal management system 304, and the power supply device 310 may be located in the container 306. In some embodiments, the container 306 may include a first compartment and a second compartment. At least one of the compressor 302 or the thermal management system 304 may be located in the first compartment. The power supply device 310 may be located in the second compartment.

In some embodiments, the first compartment may be a relatively closed space 3040 in comparison with the second compartment. Merely by way of example, the second compartment may include an open structure such as a load-carrying framework. The load-carrying framework may include a first baseplate 3061, a second baseplate 3062, and a plurality of pillars 3063 located between the first baseplate 3061 and the second baseplate 3062. The first baseplate 3061 may be located at a position higher than that where the second baseplate 3062 is located, such that the first baseplate 3061 and the second baseplate 3062 may also be referred to as a top baseplate and a bottom baseplate, respectively. Two ends of each of the plurality of pillars 3063 may be connected with the top baseplate 3061 and the bottom baseplate 3062, respectively. The plurality of pillars 3063 may be configured to fix and/or support the top baseplate 3061 and the bottom baseplate 3062. The top baseplate 3061, the bottom baseplate 3062 and the plurality of pillars 3063 may form an open space 3060 to accommodate the power supply device 310.

In some embodiments, at least one of the plurality of pillars 3063 may be detachably connected with the top baseplate 3061 and the bottom baseplate 3062. In some embodiments, when the at least one of the plurality of pillars 3063 is removed from the container 206, the power supply device 310 may be placed in and/or removed from the open space 3060 of the second compartment. In some embodiments, the top baseplate 3061 may be physically connected with a top side of the first compartment, and/or the bottom baseplate 3062 may be physically connected with a bottom side of the first compartment. For example, the top baseplate 3061 may be flush with the top side of the first compartment, and the bottom baseplate 3062 may be flush with the bottom side of the first second compartment. In some embodiments, the top baseplate 3061 and the top side of the first compartment may be integrally formed. The bottom baseplate 3062 and the bottom side of the first compartment may be integrally formed.

In some embodiments, the first compartment may be detachably connected with the second compartment. For example, the shell of the first compartment may be connected with the shell of the second compartment via one or more screws, rivets, bolts, hinges, or the like, or a combination thereof. In some embodiments, the first compartment and the second compartment may be spaced by a first baffle 3064, i.e., the first compartment and the second compartment may share a sidewall. The shared sidewall may include a hole (e.g., facing the power supply device 310) through which a maintenance personnel may enter the second compartment to repair and maintain the power supply device 310. The container 306 may further include a second baffle 3065 configured to cover the hole on the shared sidewall (i.e., the first baffle 3064). The second baffle 3065 may be detachably connected with the shared sidewall (i.e., the first baffle 3064) by one or more connection components 3066. Exemplary connection components 3066 may include a screw, a rivet, a bolt, a hinge, or the like, or any combination thereof. In some embodiments, a door 3067 may be set on a sidewall of the first compartment different from the shared wall (i.e., the first baffle 3064). When the power supply device 310 involves a malfunction and/or requires periodic maintenance, the maintenance personnel may open the door 3067 of the first compartment and enter the first compartment. The maintenance personnel may enter the second compartment through the hole on the shared sidewall (i.e., the first baffle 3064) by opening or removing the second baffle 3065 to repair and/or maintain the power supply device 310.

The compressor 302 may be configured to compress a cryogen after the cryogen cools the medical device. In some embodiments, during the transit of the superconducting device (e.g., a superconducting magnet of an MR scanner), the compressor 302 may cooperate with a refrigeration device (e.g., a cold head) to cool the medical device using the cryogen. For example, the cryogen may be heated after absorbing heat from the medical device. The heated cryogen may flow to the compressor 302. The compressor 302 may operate continuously or discontinuously to compress the heated cryogen and the compressed cryogen may flow to the refrigeration device to be cooled, which may reduce the consumption of the cryogen. During the operation of the compressor 302, the compressor 302 may generate heat. The heat generated by the compressor may be diffused in various directions from a thermovent (e.g., a vent for heat dissipation) of the compressor 302, which may result in a temperature rise in the container 306 to cause abnormal operation of the compressor 302. More description regarding the compressor 302 compressing the cryogen may be found elsewhere in the present disclosure (e.g., FIGS. 1 and 2 and the descriptions thereof).

The thermal management system 304 may be configured to in thermal communication with (e.g., cool) the compressor 302 and/or the compressed cryogen. For example, the thermal management system 304 may absorb heat generated by the compressor 302 using air. In some embodiments, the container 306 may include a first vent 3068 and a second vent 3069. The air may flow into the container 306 from the outside through the second vent 3069 of the container 206. The thermal management system 304 may exhaust the heated air from the container 306 through the first vent 3068 as shown in FIG. 4 of the container 306. The first vent 3068 and the second vent 3069 may be located at different positions on the shell of the container 206, i.e., the first vent 3068 and the second vent 3069 may be set in spaced apart, such that the air to be flowed in and the heated air to be exhausted may not be mixed with each other, thereby improving the efficiency of heat dissipation. For example, the first vent 3068 may be located on the top of the shell of the container 306 (e.g., being vertically aligned with the thermovent of the compressor 302), and the second vent 3069 may be located on a sidewall of the shell of the container 306. As another example, the first vent 3068 may face the thermal management system 304 in a vertical direction, such that the heated air may be exhausted by the heat exchanger substantially along a straight line, keeping an exhausted direction of the heated air unchanged, thereby improving the efficiency of heat dissipation.

In some embodiments, the thermal management system 304 may include an air-cooled device including a heat exchanger (also be referred to as a heat exchange fan, a cooling blower, a cooling fan, etc.). In some embodiments, the air-cooled device may further include a tube 3041, an exhaust fan 3042, etc., as shown in FIG. 4. The heat exchanger may be configured to absorb the heat generated by the compressor 302. The absorbed heat may further be absorbed by air. The tube 3041 may be configured to guide the heated air to flow from the heat exchanger to the exhaust fan 3042. The exhaust fan 3042 may be configured to exhaust the heated air from the container 306 through the first vent 3068. In some embodiments, the tube 3041 may be in fluid communication with the heat exchanger and the exhaust fan 3042. For example, the exhaust fan 3042 may be mounted on the shell of the container 306 and face the first vent 3068 which is on the top of the shell of the container 306. An end of the tube 3041 may be connected with an end of the heat exchanger away from the compressor 302, and the other end of the tube 3041 may be connected with the exhaust fan 3042, such that the tube 3041 may guide the heated air to flow from the heat exchanger to the first vent 3068 for exhaustion.

In some embodiments, the tube 3041 may be made of a soft material such as cloth, plastic, etc., to achieve a soft connection between the heat exchanger and the exhaust fan 3042. In some embodiments, at least one of the two ends of the tube 3041 may be detachably connected with the heat exchanger and/or the exhaust fan 3042. For example, when an outdoor temperature is relatively high (e.g., in Summer, Spring, or Autumn), the tube 3041 may be connected with the heat exchanger and the exhaust fan 3042. Alternatively, when the outdoor temperature is relatively low (e.g., in Winter), the tube 3041 may be removed from the heat exchanger and the exhaust fan 3042. In such cases, the container 306 may be maintained in a preset temperature range (e.g., 5° C.–38° C., 10° C.–30° C., or less than 40° C.), which reduces an effect of the outdoor temperature on the compressor 302. By a setting of the thermal management system 304 (including the air-cooled device including the heat exchanger, the tube 318041, and the exhaust fan 3042), the heat generated by the compressor 302 may be absorbed by the air and exhausted from the container 306 to the outside of the container 306, which prevents the heat from diffusing in all directions to result in a temperature rise in the container 306. The temperature rise in the container 306 may be not conducive to control the temperature in the container 206 within the preset temperature range.

The exhaust component 308 may be configured to exhaust heated air. The exhaust component 308 may further be configured for rain-protection, sun-protection, and/or dust-protection of the compressor 302 and/or the thermal management system 304. In some embodiments, the exhaust component 308 may be mounted outside the shell of the container 306. For example, the exhaust component 308 may be mounted above the first vent 3068 of the container 306 and cover the first vent 3068. That is, the first vent 3068 may be within a projection region of the exhaust component 308 on the top of the shell of the container 306. The heated air exhausted from the first vent 3068 may be further exhausted to the outside through the exhaust component 308. In addition, the exhaust component 308 may prevent the rain and/or the dust from entering the container 306 to affect the operation of the compressor 302 and the thermal management system 304. More descriptions regarding the exhaust component 308 may be found elsewhere in the present disclosure (e.g., FIG. 7 and the descriptions thereof).

The power supply device 310 may be configured to provide power for at least one of the compressor 302, the thermal management system 304, or a refrigeration device (e.g., the refrigeration device 110 as described in FIG. 1) associated with the medical device. For example, the power supply device 310 may provide power for the compressor 302 during the transit of the medical device. The power supply device 310 may include a conventional power generation device, a new energy generation device, a storage battery, etc. Exemplary conventional power generation devices may include a diesel generation device, a turbine generation device, a gasoline generation device, or the like, or any combination thereof. Exemplary new energy generation devices may include a wind power generation device, a solar power generation device, a hydrogen power generation device, or the like, or any combination thereof. Exemplary storage batteries may include a lithium-ion battery, a lead storage battery, or the like, or any combination thereof. For illustration purposes, take the diesel generation device as an example, the diesel generation device may generate heat and soot during the operation of the diesel generation device. By placing the diesel generation device in the second compartment with an open structure, the heat and soot generated by the diesel generation device may be discharged to the outside of the container 306 with improved efficiency, which may not affect the operation of the compressor 302 and/or the thermal management system 304.

The damping device 312 may be configured to reduce the vibration of the compressor 302 during the transit of the medical device. One end of the damping device 312 may be connected with or fixed on the bottom of the container 306, and the other end of the damping device 312 may be connected with the compressor 302 to support the compressor 302. In some embodiments, the damping device 312 may include one or more damping components and a connection plate 3122. The one or more damping components may include a damping spring made of a metal material, a damping rubber made of rubber, a damping gasbag filled with air, or the like, or any combination thereof. As shown in FIG. 4, take one or more damping springs 3121 as an example, the connection plate 3122 may be mounted between the one or more damping springs 3121 and the compressor 302 to support the compressor 302. An end of each of the one or more damping springs 3121 may be mounted on the bottom of the container 306, and another end of each of the one or more damping springs 3121 may be connected with the connection plate 3122. The one or more damping springs 3121 may be configured to offset or reduce the vibration of the compressor 302 by deformation. The larger a count or number of the one or more damping springs 12 is, the greater the damping effect of the damping device 312 may be. In some embodiments, the one or more damping springs 3121 may be arranged evenly. For example, the one or more damping springs 3121 may be arranged in a matrix. As another example, a count of the one or more damping springs 3121 may be 4. The 4 damping springs 3121 may be located at four corners of the connection plate 3122.

In some embodiments, the apparatus 300 may be loaded to and/or unloaded from a transportation tool (e.g., a truck). For example, the container 306 may include one or more lifting lugs 3070 on the top of the container 306 (e.g., on the top baseplate 3061 of the second compartment and the top of the shell of the first compartment as shown in FIGS. 3-5). The apparatus 300 may be loaded to and/or unloaded from the transportation tool by lifting via the one or more lifting lugs 3070. As another example, the container 306 may include one or more cross-bars 3071 on the bottom of the container 306 (e.g., on the bottom baseplate 3062 of the second compartment and the bottom of the shell of the first compartment as shown in FIGS. 3 and 4). The apparatus 300 may be loaded to and/or unloaded from the transportation tool by a forklift inserting a gap between two adjacent cross-bars 3071. Further, each of the one or more cross-bars 3071 may include one or more holes 3072. Each of the one or more holes 3072 may include a regular shape (e.g., a circle, a square, a rectangular, or an oval) or an unregular shape. After the container 306 is loaded to the transportation tool, the container 306 may be fixed on the transportation tool based on the one or more holes 3072 and/or the one or more lifting lugs 3070.

In some embodiments, the apparatus 300 may include one or more sensors, positioning circuits, communication circuits, etc., for the acquisition and transmission of information for the transit of the medical device. The one or more sensors may include a temperature sensor, a power level sensor, a humidity sensor, a positioning module, a communication circuit, etc. For example, as shown in FIG. 3, the apparatus 300 may include a temperature sensor 316 located in the container 306 (e.g., the first compartment of the container 306). The temperature sensor 316 may be configured to detect the temperature in the container 306 (i.e., a temperature in the first compartment of the container 306). In some embodiments, the temperature sensor 316 may be connected with the control device 314 (e.g., by an electronic connection). The temperature sensor 316 may send the detected temperature to the control device 314 for further processing.

As another example, as shown in FIG. 5, the apparatus 300 may include a power level sensor 318, a positioning module 319, a communication circuit 320, etc. In some embodiments, the power level sensor 318 and/or the positioning module 319 may be connected with the communication circuit 320 (e.g., by an electronic connection). The power level sensor 318 may be configured to detect a power level of the power supply device 310. Take the diesel generation device as an example, the power level sensor 318 may include an oil level sensor, and the power level may include an oil level. The oil level sensor may detect the oil level of the diesel generation device. The positioning module 319 may be configured to detect a geographic location of the apparatus 300. In some embodiments, the positioning module 319 may achieve the location detection based on a Global Positioning System (GPS) principle, a global navigation satellite system (GLONASS) principle, a compass navigation system (COMPASS) principle, a BeiDou navigation satellite principle, a Galileo positioning principle, a quasi-zenith satellite system (QZSS) principle, a location-based service (LBS) principle (also referred to as a base station positioning principle), etc. The communication circuit 320 may be configured to facilitate a communication between components. For example, the communication circuit 320 may send the power level (e.g., the oil level) and/or the geographic location to a terminal. The terminal may display the power level and/or the geographic location for a user associated with the terminal. In some embodiments, the communication circuit 320 may include a long distance communication circuit such as a general packet radio service (GPRS).

In some embodiments, a remaining distance to a destination for the transmit of the medical device may be determined based on the geographic location of the apparatus 300 (e.g., by the user or automatically). Whether the power level of the power supply device 310 satisfies a power requirement for the remaining distance may be determined based on the remaining distance (e.g., by the user or automatically). If the power level of the power supply device 310 doses not satisfy the power requirement for the remaining distance, a power required to be added (e.g., a diesel fuel required to be added) may be determined, such that the user (e.g., a driver in charge of the transit of the medical device) can timely charge the power supply device 310 (e.g., by adding at least the required diesel fuel), thereby achieving uninterrupted power supply to components (e.g., the compressor 302) of the apparatus 300 during the transit process.

In some embodiments, the apparatus 300 may further include a control device 314. The control device 314 may be configured to control an operation of one or more components (e.g., the exhaust fan 3042, the compressor 302, or the power supply device 310) in the apparatus 300. In some embodiments, the control device 314 may acquire internal information, such as information associated with the one or more components for the transit of the medical device (e.g., a power level of the power supply device 310, a geographic location of the apparatus 300, etc.), a room temperature, external information (e.g., environment information, such as an outdoor temperature, weather, etc.) during the transit of the medical device. The control device 314 may control the operation of the one or more components based on the internal information and/or the external information. For example, the control device 314 may determine whether a temperature in the container 306 (e.g., in the first compartment of the container 306) is higher than a threshold. The threshold may be associated with the preset temperature range that the container 306 requires to be maintained. For instance, if the preset temperature range is less than 40° C., the threshold may be denoted as an upper limiting value of the temperature range, i.e., 40° C. In response to a determination that the temperature in the first compartment is higher than the threshold, the control device 314 may cause the exhaust fan 3042 to operate. As another example, the control device 314 may determine whether a temperature in the container 306 (e.g., in the first compartment of the container 206) is within the preset temperature range. In response to a determination that the temperature is within the preset temperature range, the control device 314 may cause the exhaust fan 3042 to stop. As still an example, the control device 314 may control, based on the temperature in the container 306, a rotation speed of the exhaust fan 3042 to control the heat dissipation of the compressor 302. The higher the rotation speed of the exhaust fan 3042 is, the higher the speed of exhausting the heated air generated by the compressor 302 and a speed of heat dissipation may be. As a further example, the control device 314 may determine whether the power level of the power supply device 310 satisfies a condition. In response to a determination that the power level satisfies the condition, the control device 314 may cause the power supply device 310 to stop. The condition may include that the power level is less than a threshold power. As still a further example, the control device 314 may determine whether a malfunction exists in the apparatus 300. In response to a determination that a malfunction exists, the control device 314 may cause at least one of the power supply device 310, the compressor 302, the thermal management system 304, etc. of the apparatus 300 to stop. As further another example, the control device 314 may be in communication with or connected with the power supply device 310. The control device 314 may adjust parameters of the power supply device 310 (e.g., reduce and/or rectify a voltage generated by the power supply device 310) to provide power for one or more components (e.g., the control device 14, the exhaust fan 3042, a temperature sensor 316, a power level sensor 318, a positioning module 154, and/or a communication circuit 320) of the apparatus 300. As further another example, the control device 314 may cause the power supply device 310 to operate. After the power supply device 310 has been operated for a preset period, the control device 314 may cause the compressor 102 and the exhaust fan 115 to operate simultaneously, which ensures that the power supply device 310 provides power to the compressor 102, the exhaust fan 115, etc. after the power supply device 310 can output stabilized voltages.

In some embodiments, the control device 314 may send the information to a terminal. The terminal may include a display component to display the received information for a user (e.g., a transport personnel in charge of the transit of the medical device, a control personnel or a manufacturer of the medical device) associated with the terminal. In some embodiments, the terminal may include a touch panel, an input component (e.g., a mouse, a microphone, and/or a keyboard), an output component (e.g., a speaker), or the like, or any combination thereof for the user to provide a feedback of the user in response to the displayed information. For instance, the display component may include a cathode-ray display, a led display, an electroluminescent display, an electronic paper, a plasma display panel, a liquid crystal display, an organic light-emitting semiconductor display, a surface conductive electron emission display, etc.

In some embodiments, the control device 314 may include a processing device. The processing device may include a central processing unit (CPU), a digital signal processor (DSP), a system on a chip (SoC), a microcontroller unit (MCU), or the like, or any combination thereof. In some embodiments, the processing device 120 may include a computer, a user console, a single server or a server group, etc. The server group may be centralized or distributed. In some embodiments, the processing device may be local or remote. In some embodiments, the processing device may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the control device 314 may be integrated into the terminal of the user.

It should be noted that the above description of the apparatus 300 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the container 306 may include a third compartment to accommodate the medical device. In some embodiments, the apparatus 300 may be a part of the medical device. In some embodiments, one or more components may be omitted in the apparatus 300. In some embodiments, one or more additional components may be added in the apparatus to facilitate the cooling performance of the apparatus 300.

Figure 7:
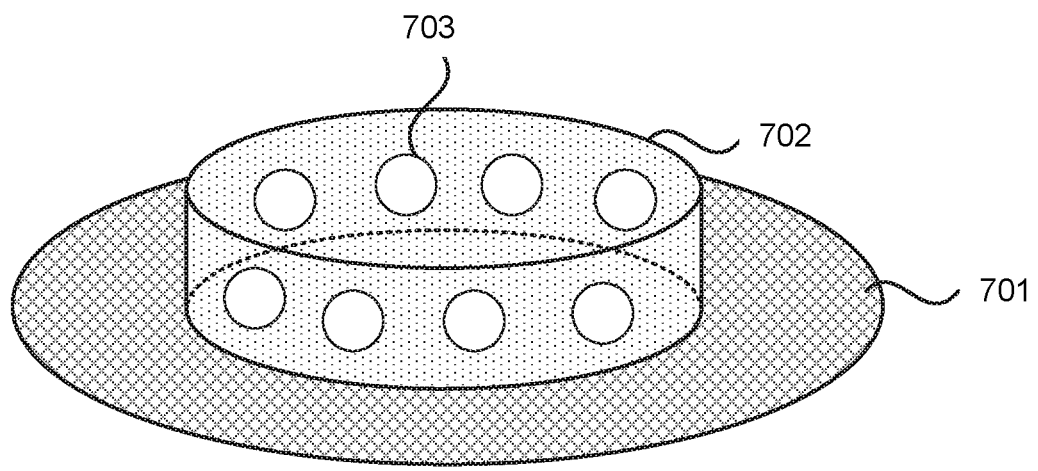
FIG. 7 is a schematic diagram illustrating an exemplary exhaust component according to some embodiments of the present disclosure.

FIG. 7 is a schematic diagram illustrating an exemplary exhaust component according to some embodiments of the present disclosure. As shown in FIG. 7, the exhaust component 308 may include a first part 701 and a second part 702 connected with the first part 701. In connection with FIGS. 3-6, an end of the first part 701 far away from the second part 702 may be connected with the exhaust fan 3042 of the thermal management system 304, that is, the first part 701 may be located between the second part 702 and the exhaust fan 3042. The first part 701 and/or the second part 702 may be made of a waterproof material, a sunscreen material, a heat resistance material, or the like, or any combination thereof. For example, the first part 701 may be made of stainless steel, and the second part 702 may be made of oil cloth. As another example, both the first part 701 and the second part 702 may be made of stainless steel. As still an example, the first part 701 may be made of aluminum alloy, and the second part 702 may be made of stainless steel.

In some embodiments, the first part 701 may be hollow and configured with at least one hole 703. The first part may also be referred to as a hollow part. For illustration purposes, the first part 701 may include a hollow cylinder as shown in FIG. 7, which is not intended to limit the structure of the first part 701, and the first part 701 may include any suitable hollow structure. Each of the at least one hole 703 may include a regular shape (e.g., a circle, a square, a rectangle, or an oval) or an irregular shape. A size of the at least one hole 703 may be the same as or different from each other. The at least one hole 703 may be arranged evenly or randomly on the sidewall of the first part 701. After the heated air is guided from the heat exchanger of the thermal management system 304 to the first vent 3068 through the tube 3041 and the exhaust fan 3042, the heated air may further be exhausted to the outside through the at least one hole 703 of the first part 701. The greater a count of the at least one hole 703 is and/or the larger the size of the at least one hole 703 is, the better effect of exhausting the heated air may be. In some embodiments, the second part 702 may be configured to shelter the first vent 3068, avoiding foreign matters (e.g., the rain, the dust, etc.) falling down from the first vent 3068 on the top of the shell of the container 306 to the container 306. The second part 702 may include any suitable shape or structure as long as the second part 702 can shelter the first vent 3068 and/or the first part 701, e.g., the first vent 3068 being within a projection region of the second part 702 on the container 306. The second part 702 may also be referred to as a shelter part. For example, the second part 702 may have a circle shape, a square shape, etc. As another example, the second part 702 may include a structure (e.g., a cylinder-shaped structure, a paraboloid-shaped structure) that can cover the first part 701. In some embodiments, the wall of the second part 702 (e.g., a cylinder-shaped structure) may enclose the first part 701. The second part 702 may not contact with the top of the shell of the container 306, which ensures the shelter effect of the second part 702 and the exhaust effect of the at least one hole 703 of the first part 701.

It should be noted that the above description of the exhaust component 308 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the exhaust component 308 may include one or more additional parts to facilitate the shelter effect and/or the exhaust effect.

Figure 8:
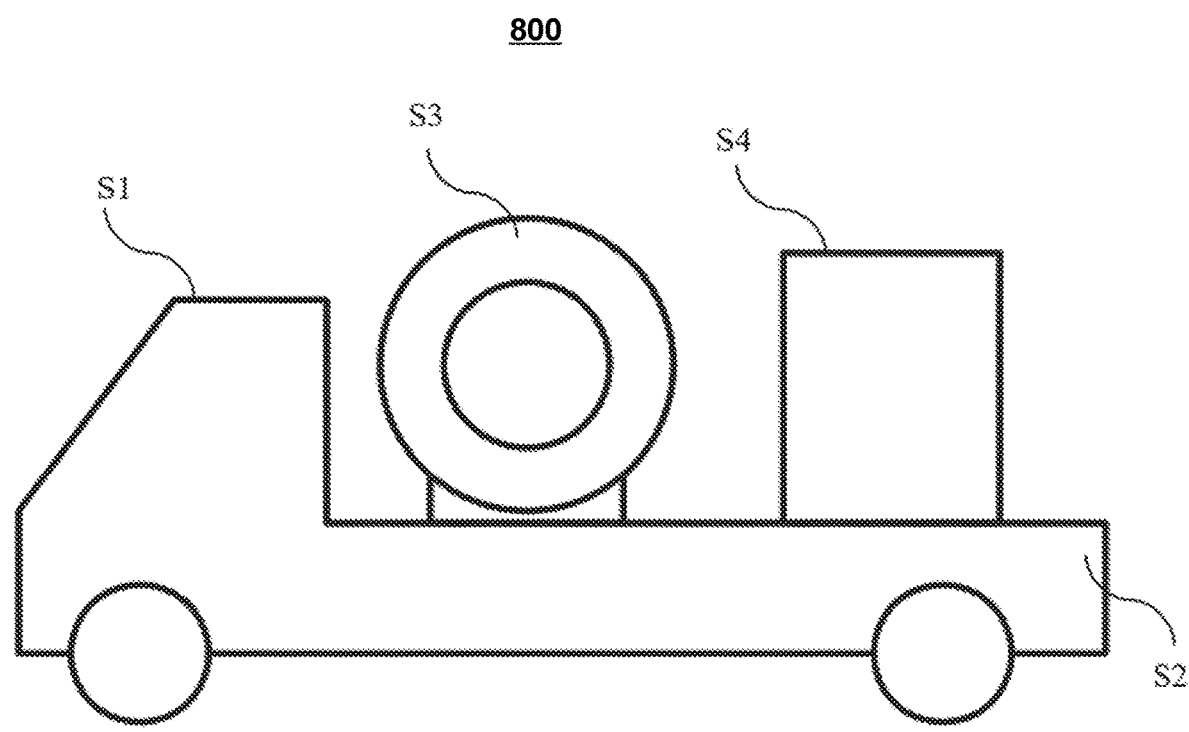
FIG. 8 is a schematic diagram illustrating an exemplary system for the transit of a superconducting device according to some embodiments of the present disclosure.

FIG. 8 is a schematic diagram illustrating an exemplary system for the transit of a superconducting device according to some embodiments of the present disclosure. The system may be associated with a manned and/or unmanned transportation tool such as a vehicle, a ship, an airplane, etc. for the transit of the superconducting device (e.g., a medical device). As shown in FIG. 8, the system 800 may include a driving cab S1, a movable platform S2, a superconducting magnet S3, and an apparatus S4. The movable platform S2 may be physically connected with the driving cab S1. In some embodiments, one or more signal transmission lines, one or more tubes, or the like, or any combination may be set between the driving cab S1, the movable platform S2, the superconducting magnet S3, and/or the apparatus S4 to, e.g., facilitate communications thereof.

The driving cab S1 may be configured to control the transit of the medical device. In some embodiments, a transport personnel (e.g., a driver in charge of the transit of the medical device) may perform operations (e.g., operate a transportation tool associated with the driving cab S1) in the driving cab S1 to finalize the transit of the medical device. In some embodiments, the driving cab S1 may be configured with a terminal which is similar to or same as a terminal as described elsewhere in the present disclosure (e.g., FIGS. 3-6 and the descriptions thereof). The transport personnel may be informed of information associated with the apparatus S4 via the terminal during the transit of the superconducting magnet S3.

The movable platform S2 may be configured to support at least one of the superconducting magnet S3 and the apparatus S4. The superconducting magnet S3 and the apparatus S4 may be moved as the movable platform S2 moves. For example, the superconducting magnet S3 may be accommodated in a cryostat including a refrigeration device. The cryostat may be placed on the movable platform S2. As another example, the apparatus S4 may include a container as described elsewhere in the present disclosure (e.g., FIGS. 3-6 and the descriptions thereof). The container may be placed on the movable platform S2. In some embodiments, the movable platform S2 may include different forms (e.g., a box structure or an open structure) according to different types of the transportation tools. For example, the movable platform S2 may include a carriage of a truck, a warehouse of a ship, a cabin of an airplane, etc.

The superconducting magnet S3 may be implemented on a medical device (e.g., an MR scanner). The MR scanner may further include a cryostat that includes a refrigeration device, etc. In some embodiments, the cryostat may be filled with a cooling medium (e.g., a cryogen such as liquid helium or a hyperpolarized material) in an accommodation space of the cryostat to submerge the superconducting magnet S3.

In some embodiments, the cryostat may include an inner vessel, an outer vessel, and one or more seal heads. The inner vessel and the outer vessel may have shapes of cylinders and be arranged coaxially. Two seal heads may be located at two ends of the cryostat along an axis direction of the cryostat, respectively. The inner vessel or the outer vessel may include an inner layer, a middle layer, and an outer layer from the inside to the outside. The middle layer may be configured for thermal shielding. The inner layer and the outside layer may form a vacuum. In some embodiments, the superconducting magnet S3 may include a main magnet that can generate a main magnet filed for the MR scanner to perform a scan. The main magnet may include a frame and one or more superconducting coils wound on the frame. The superconducting coils may be thermally coupled to the cooling medium. In some embodiments, the refrigeration device may be similar to or same as the refrigeration device 110 as described elsewhere in the present disclosure. The refrigeration device may include a cold head assembly. The cold head assembly may include a first cold head and a second cold head with different relatively low temperatures. The first cold head may be located between the outer layer and the middle layer of the cryostat and be configured to keep the cooling medium surrounding the first cold head in a first temperature ranging from 40 K-70 K. The second cold head may extend from the middle layer to the inner layer of the cryostat and be configured to keep the cooling medium surrounding the second cold head in a second temperature below 10 K. For example, the first temperature may be set to be 50 K, and the second temperature may be set to be 4.2 K. More descriptions regarding the superconducting magnet S3 may be found elsewhere in the present disclosure (e.g., FIGS. 9 and 10 and the descriptions thereof).

The apparatus S4 may be configured to refrigerate the superconducting magnet S3 during the transit of the medical device. The apparatus S4 may be the same as or similar to the apparatus 100, the apparatus 200, and/or the apparatus 300 as described elsewhere in the present disclosure. For example, the apparatus S4 may include a container (e.g., the same as or similar to the container 306), a compressor (e.g., the same as or similar to the compressor 302), a thermal management system (e.g., the same as or similar to the thermal management system 304), a power supply (e.g., the same as or similar to the power supply 310), an exhaust component (e.g., the same as or similar to the exhaust component 308), a damping device (e.g., the same as or similar to the damping device 312), one or more sensors, a control device, or the like, or any combination thereof.

In some embodiments, the container may include a first compartment and a second compartment sharing a sidewall with the first compartment. The first compartment may be configured to accommodate at least one of the compressor, the thermal management system, or the exhaust component. The second compartment may be configured to accommodate the power supply device. In some embodiments, the second compartment may include a structure of a load-carrying framework.

In some embodiments, the compressor may be configured to compress a cryogen after the cryogen cools the superconducting magnet S3 in the transit of the superconducting magnet S3. For example, the compressor may be in fluid communication with the refrigeration device (e.g., a cold head assembly). The refrigeration device may be configured to supply refrigeration of the superconducting magnet S3 using the compressed cryogen.

In some embodiments, the thermal management system may be configured to cool the compressor and/or the compressed cryogen. The compressed and/or cooled cryogen may be used to cool the superconducting magnet S3. For example, the thermal management system may include an air-cooled device including a heat exchanger, an exhaust fan mounted on a shell of the container, and a tube in fluid communication with the heat exchanger and the exhaust fan. The heat exchanger may be configured to absorb heat generated by the compressor using air which enters from the outside via a first vent of the container. The tube may be configured to guide the heated air to flow from the heat exchanger to the exhaust fan. The exhaust fan may be configured to exhaust the heated air from the container via a second vent of the container.

In some embodiments, the power supply device may be configured to provide power to at least one of the compressor, the thermal management system, or the refrigeration device during the transit of the superconducting magnet S3. The power supply device may electronically be connected with at least one of the compressor, the thermal management system, or the refrigeration device.

In some embodiments, the exhaust component may be located outside the container. The exhaust component may include a first part connected with the exhaust fan through the first vent and a second part configured to shelter the first vent and connected with the first part, wherein the first vent is within a projection region of the second part on the container. The first part may be hollow and be configured with at least one hole.

In some embodiments, the damping device may be mounted in the container. The damping device may include one or more damping springs and a connection plate mounted between the one or more damping springs and the compressor. An end of each of the one or more damping springs may be mounted on a bottom of the container. The connection plate may be configured to support the compressor.

In some embodiments, the one or more sensors may include a power level sensor (e.g., the same as or similar to the power level sensor 318), a temperature sensor (e.g., the same as or similar to the temperature sensor 316), etc. For example, the power level sensor may be configured to detect a power level of the power supply device and send the detected power level to the driving cab S1 for display. As another example, the temperature sensor may be configured to detect a room temperature in the container and send the detected room temperature to the driving cab S1.

In some embodiments, the control device may be configured to control an operation of each of one or more components in the apparatus S4. For example, the control device may obtain a power level of the power level supply and send the power level to a terminal. As another example, the control device may obtain a room temperature in the container and control a rotation speed of the exhaust fan based on the room temperature. As still another example, the control device may stop at least one of the compressor, the power supply device, or the thermal management system in response to determining that a malfunction exists. In some embodiments, the control device may be integrated into the driving cab S1 or the terminal.

It should be noted that the above description of the system 800 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the system 800 may include one or more additional components. In some embodiments, one or more components in the system 800 may be omitted.

Figure 9:
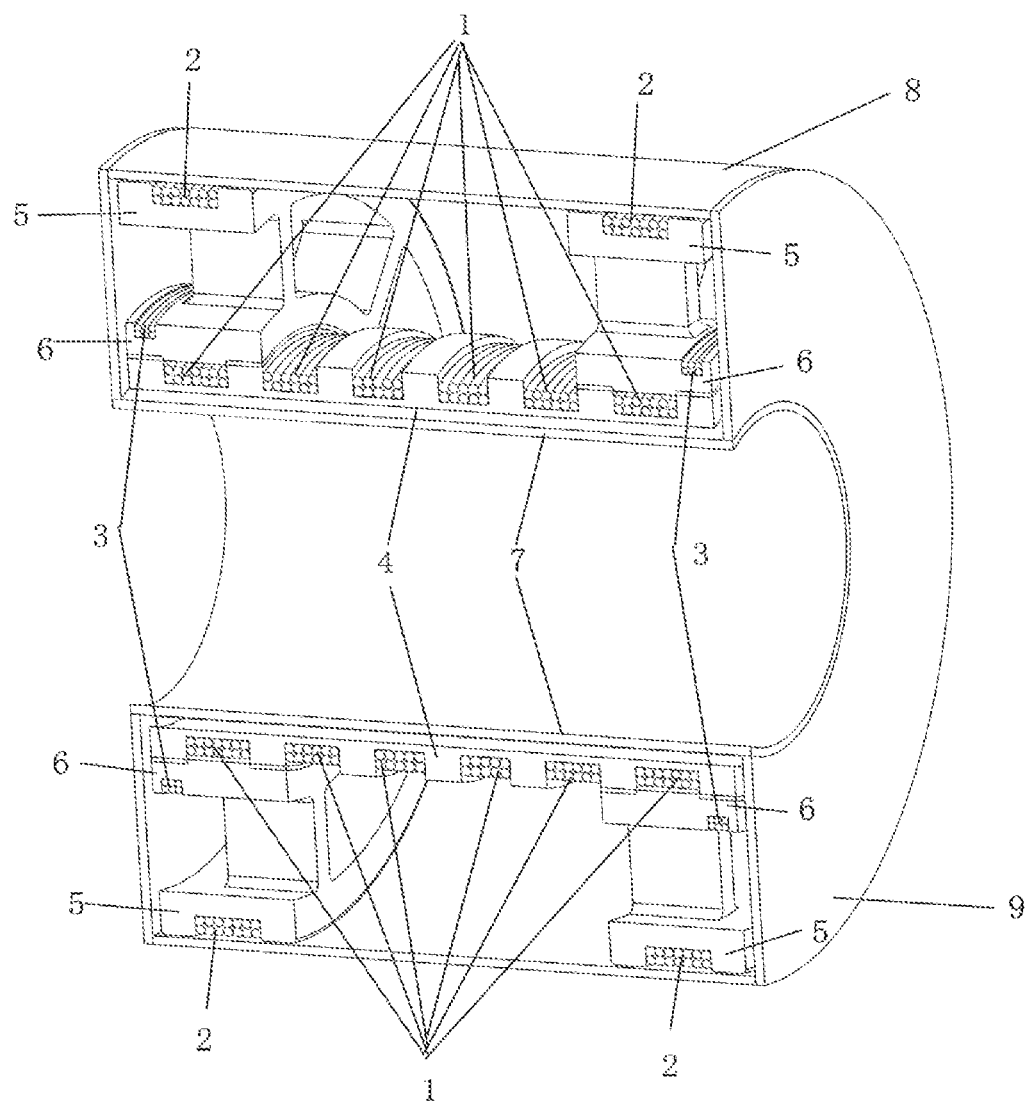
FIG. 9 is a schematic diagram illustrating an exemplary superconducting magnet of an MR scanner according to some embodiments of the present disclosure.

FIG. 9 is a schematic diagram illustrating an exemplary superconducting magnet of an MR scanner according to some embodiments of the present disclosure.

In some embodiments, the superconducting magnet 900 may be accommodated in a cryostat. The cryostat may include an inner vessel 7, an outer vessel 8, and two seal heads 9. The inner vessel 7 and the outer cylinder 8 may have shapes of cylinders and be arranged coaxially. Two seal heads 9 may be located at two ends of the cryostat along a direction of the axis of the t cryostat respectively. Each of the two seal heads 9 may be used to connect the inner vessel 7 with the outer vessel 8 at one of the two ends of the cryostat. In some embodiments, the cryostat may be filled with a cryogen (e.g. liquid helium) in a relatively low temperature. In some embodiments, the cryostat may be refrigerated based on a compressor and a refrigeration device during the transmit of the superconducting magnet as described elsewhere in the present disclosure (e.g., FIGS. 1-6 and the descriptions thereof). The refrigerated cryostat may keep the superconducting magnet in the relatively low temperature.

As shown in FIG. 9, the superconducting magnet 900 may include one or more magnetic coils. The magnetic coil(s) may include one or more first coils (also referred to as main coils) 1, one or more second coils (also referred to as shielding coils) 2, and one or more third coils (also referred to as shim coils) 3. The first coil(s) 1 may consist of a plurality of coils connected in series. The plurality of coils may be made of superconducting materials. The one or more first coils 1 may be configured to generate a main magnetic field. The one or more second coils 2 may be configured to constrain a clutter magnetic field. The one or more third coils 3 may be configured for an active shimming, e.g., generating a corrective magnetic field. The first coil(s) 1 may be submerged in the cryogen to maintain a low temperature superconducting state with a zero resistance. Then, the first coil(s) 1 may be electrified to generate the main magnetic field with a relatively high strength.

In some embodiments, the superconducting magnet 900 may include a first bracket (also referred to as a main coil frame) 4 and a second bracket (also referred to as a shielding coil frame). The second bracket may include an outer frame 5 relatively close to the second coil(s) 2 and an inner frame 6 relatively far away from the second coil(s) 2. The first coil(s) 1 may be wound on the main coil frame 4. The second coil(s) 2 may be wound on the outer frame 5. The third coil(s) 3 may be wound on the inner frame 6. In some embodiments, the inner frame 6 may be connected with (e.g., bonded to) an outer surface of the first coil 4. The outer frame 5 may be connected with an inner wall of the outer vessel 8. Therefore, the second coil(s) 2 may be wound on the outer frame 5 along a circumferential direction of the cryostat (e.g., a circumferential direction of the inner vessel 7 or the outer vessel 8), and the third coil(s) 3 may be wound on the circumferential direction of the cryostat. In some embodiments, an outer surface of the inner vessel 7 may be connected with the first frame 4, such that the first coil(s) 1 may be wound on the first frame 4 along the circumferential direction of the cryostat (e.g., a circumferential direction of the inner vessel 7 or the outer vessel 8).

Figure 10:
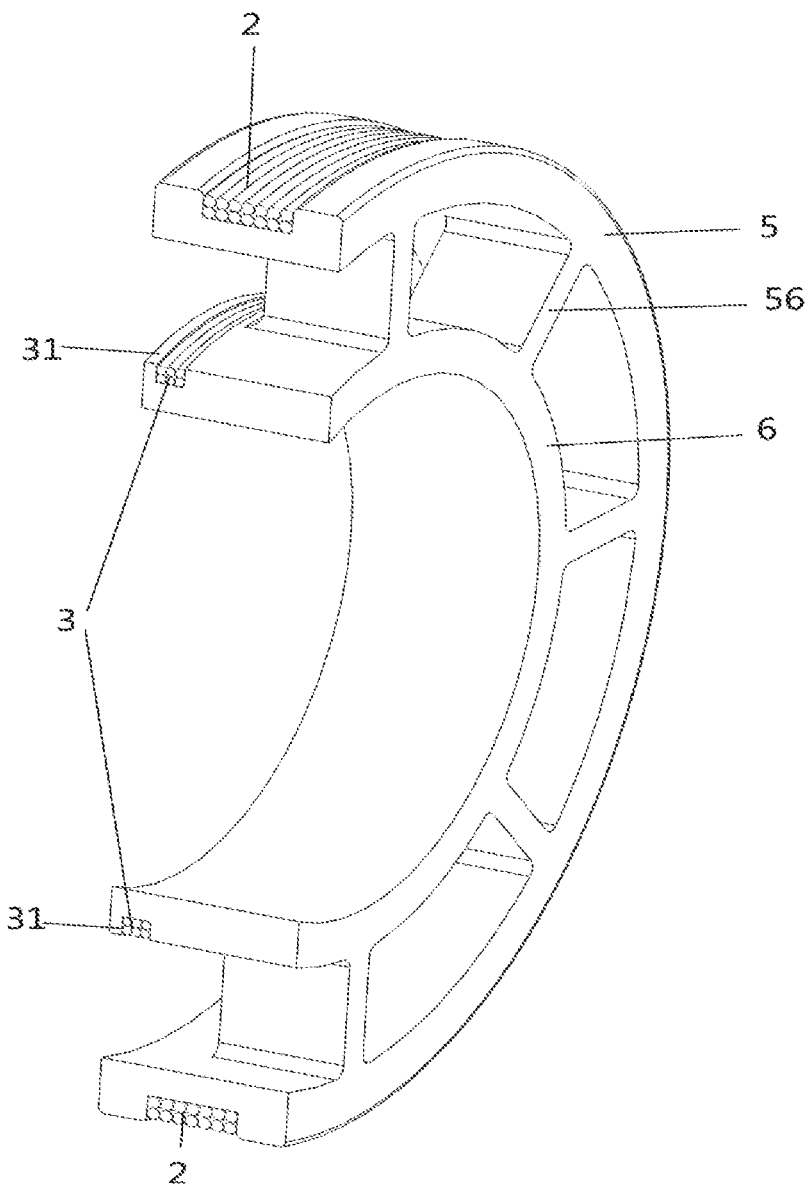
FIG. 10 is a schematic diagram illustrating an exemplary shielding coil frame according to some embodiments of the present disclosure.

FIG. 10 is a schematic diagram illustrating an exemplary shielding coil frame according to some embodiments of the present disclosure. In some embodiments, the shielding coil frame may be an enlarged view of the shielding coil frame as shown in FIG. 9. As shown in FIG. 10, the shielding coil frame may include one or more support bars 56 between the outer frame 5 and the inner frame 6 for connecting the outer frame 5 and the inner frame 6 and strengthening structural strength of the cryostat.

In some embodiments, an outer surface of the inner frame 6 may include a groove 31 extending along the circumferential direction of the cryostat, such that the third coil(s) 3 may be wound on the inner frame 6 along the groove 31. In some embodiments, the third coil(s) 3 may be wound on the inner frame 6 along the groove 31 using a dry winding mode. After the winding, the third coil(s) 3 may be fixed in the groove 31. Merely by way of example, the third coil(s) 3 may be fixed by filling the groove 31 with a glue (e.g., an epoxy resin) in a vacuum state.

In some embodiments, the third coil(s) 3 may be made of a superconducting material. For example, the third coil(s) 3 may include a non-ideal second-class superconductor such as a NbTi copper-based superconducting coil. In some embodiments, the third coil(s) 3 may include two groups each of which is close to one seal head of the two seal heads 9 at two ends of the cryostat along the axis direction. The two groups of the third coils 3 may be connected in series.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer-readable program code embodied thereon.

A non-transitory computer-readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer-readable signal medium may be any computer-readable medium that is not a computer-readable storage medium and that may communicate, propagate, or transport a program for use by or in connection with an instruction execution system, apparatus, or device. Program code embodied on a computer-readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C #, VB. NET, Python or the like, conventional procedural programming languages, such as the "C" programming language, Visual Basic, Fortran, Perl, COBOL, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. An apparatus for a transit of a superconducting magnet, comprising:
    a compressor configured to compress a cryogen after the cryogen cools a superconducting magnet in the transit of the superconducting magnet, the compressed cryogen being used to supply refrigeration for the superconducting magnet;
    a power supply device configured to provide power to the compressor;
    a thermal management system in thermal communication with the compressor wherein thermal management system includes an air-cooled device that is in thermal communication with the compressor via air, the air-cooled device including
        a heat exchanger configured to absorb heat generated by the compressor using air;
        an exhaust fan mounted on a shell of the container; and
        a tube in fluid communication with the heat exchanger and the exhaust fan, the tube being configured to guide the heated air to flow from the heat exchanger to the exhaust fan; and
    a container configured to accommodate at least one of the compressor, the thermal management system, and the power supply device.

2. The apparatus of claim 1, wherein the container includes a first compartment and a second compartment, at least one of the compressor or the thermal management system is located in the first compartment, the power supply device is located in the second compartment, and the power supply device is electronically connected with the compressor.

3. The apparatus of claim 2, wherein the second compartment is connected with the first compartment.

4. The apparatus of claim 2, wherein the first compartment and the second compartment share a sidewall, and the second compartment includes a structure of a load-carrying framework.

5. The apparatus of claim 1, wherein the container includes:
a first vent through which the heated air is exhausted from the container via the exhaust fan; and
a second vent through which the air flows into the container.

6. The apparatus of claim 5, further comprising an exhaust component located outside the container, wherein the exhaust component includes:
a first part connected with the exhaust fan through the first vent, wherein the first part is hollow and is configured with at least one hole; and
a second part configured to shelter the first vent and connected with the first part, wherein the first vent is within a projection region of the second part on the container.

7. The apparatus of claim 1, further comprising a damping device mounted in the container, wherein the damping device includes:
one or more damping springs, an end of each of the one or more damping springs being mounted on a bottom of the container; and
a connection plate mounted between the one or more damping springs and the compressor, the connection plate being configured to support the compressor.

8. The apparatus of claim 1, further comprising a temperature sensor configured to detect a temperature in the container.

9. The apparatus of claim 1, further comprising a control device configured to control an operation of each of one or more components in the apparatus.

10. The apparatus of claim 9, wherein the control device is configured to:
obtain a power level of the power supply device; and
send the power level to a terminal.

11. The apparatus of claim 1, wherein the power supply device includes a diesel generator.

12. A magnetic resonance system, comprising:
a superconducting magnet that is located in a cryostat including a refrigeration device;
a compressor in fluid communication with the refrigeration device, the compressor being configured to compress a cryogen after the cryogen cools the superconducting magnet, and the refrigeration device being configured to supply refrigeration of the superconducting magnet using the compressed cryogen in a transit of the superconducting magnet;
a thermal management system including an air-cooled device configured to be in thermal communication with the compressor via air, wherein the air-cooled device includes
a heat exchanger configured to absorb heat generated by the compressor using air;
an exhaust fan mounted on a shell of the container; and
a tube in fluid communication with the heat exchanger and the exhaust fan, the tube being configured to guide the heated air to flow from the heat exchanger to the exhaust fan; and
a container configured to accommodate the compressor or the thermal management system.

13. The magnetic resonance system of claim 12, further includes a power supply configured to provide power to at least one of the compressor or the refrigeration device, or the thermal management system.

14. The magnetic resonance system of claim 13, wherein the container includes a first compartment and a second compartment, wherein at least one of the compressor or the thermal management system is located in the first compartment, a power supply device is located in the second compartment, and the power supply device is electronically connected with the compressor.

15. A system, comprising:
a driving cab configured to control a transit of a medical device;
a cryostat configured to accommodate the medical device and provide a low temperature for the medical device, the cryostat including a refrigeration device;
a compressor in fluid communication with the refrigeration device, the compressor being configured to compress a cryogen after the cryogen cools a superconducting magnet of the medical device, and the refrigeration device being configured to supplying refrigeration of the superconducting magnet using the compressed cryogen in the transit of the medical device;
a thermal management system comprising an air-cooled device configured to be in thermal communication with the compressor via air, wherein the air-cooled device includes
a heat exchanger configured to absorb heat generated by the compressor using air;
an exhaust fan mounted on a shell of the container; and
a tube in fluid communication with the heat exchanger and the exhaust fan, the tube being configured to guide the heated air to flow from the heat exchanger to the exhaust fan;
a container configured to accommodate at least one of the compressor, the thermal management system and the cryostat; and
a movable platform in communication with the driving cab, the moveable platform being configured to support the container.

16. The system of claim 15, further includes a power supply configured to provide power to at least one of the compressor, the refrigeration device or the thermal management system.

17. The system of claim 16, wherein the container includes a first compartment and a second compartment, at least one of the compressor or the thermal management system is located in the first compartment, a power supply device is located in the second compartment, and the power supply device is electronically connected with the compressor.

* * * * *